United States Patent
Wilkins et al.

(10) Patent No.: US 9,509,032 B2
(45) Date of Patent: Nov. 29, 2016

(54) RADIO FREQUENCY CONNECTION ARRANGEMENT

(71) Applicant: Cambium Networks Limited, Ashburton, Devon (GB)

(72) Inventors: Adam Wilkins, Plymouth (GB); Carl Morrell, Kingsteignton (GB); Paul Clark, Paignton (GB); Peter Spence, Kingsbridge (GB); Nigel Jonathan Richard King, Battery (GB)

(73) Assignee: Cambium Networks Limited, Ashburton, Devon (GB)

( * ) Notice: Subject to any disclaimer, the term of this patent is extended or adjusted under 35 U.S.C. 154(b) by 0 days.

(21) Appl. No.: 14/839,323

(22) Filed: Aug. 28, 2015

(65) Prior Publication Data
US 2016/0087326 A1   Mar. 24, 2016

(30) Foreign Application Priority Data

Aug. 28, 2014 (GB) .................................. 1415272.2

(51) Int. Cl.
| | | |
|---|---|---|
| *H01P 5/08* | (2006.01) | |
| *H01P 5/02* | (2006.01) | |
| *H05K 1/02* | (2006.01) | |
| *H01P 3/08* | (2006.01) | |
| *H01P 11/00* | (2006.01) | |
| *H05K 1/14* | (2006.01) | |

(52) U.S. Cl.
CPC ................ *H01P 5/085* (2013.01); *H01P 3/08* (2013.01); *H01P 5/028* (2013.01); *H01P 11/003* (2013.01); *H05K 1/0251* (2013.01); *H05K 1/144* (2013.01); *H05K 2201/09054* (2013.01); *H05K 2201/10303* (2013.01)

(58) Field of Classification Search
CPC .......... H01P 3/08; H01P 3/081; H01P 3/082; H01P 5/028; H01P 5/085; H01P 11/003; H05K 1/0251
USPC .................................................. 333/238, 246
See application file for complete search history.

(56) References Cited

U.S. PATENT DOCUMENTS

| | | | |
|---|---|---|---|
| 5,963,111 A | * 10/1999 | Anderson | ............... H01P 5/085 333/128 |
| 2004/0053014 A1 | 3/2004 | Sato | |
| 2005/0104692 A1 | 5/2005 | Lee | |

FOREIGN PATENT DOCUMENTS

WO    WO 2008/109662 A1    9/2008

OTHER PUBLICATIONS

UKIPO Search Report from corresponding Great Britain Application No. GB1415272.2; Feb. 23, 2015; 4 pages.

* cited by examiner

*Primary Examiner* — Benny Lee
*Assistant Examiner* — Albens Dieujuste
(74) *Attorney, Agent, or Firm* — Brinks Gilson & Lione

(57) ABSTRACT

A radio frequency transmission arrangement comprises a ground plate (8) having first and second opposite sides and a boss protruding from said second side of the ground plate (8), a first transmission line comprising a first elongate conductor (1) passing from the first side of the ground plate through an aperture (3) in the ground plate and the boss, and a second transmission line comprising a second elongate conductor (2) and a ground plane (6), the first elongate conductor (1) passing through the ground plane (6) to connect to the second elongate conductor. The boss has an end surface (4) disposed in a substantially parallel relationship with the ground plane (6) of the second transmission line, and there is a gap between the end surface of the boss and the ground plane.

21 Claims, 6 Drawing Sheets

RADIO FREQUENCY CONNECTION ARRANGEMENT

RELATED APPLICATION

This application claims the benefit of priority to Great Britain Application No. GB 1415272.2, filed on Aug. 28, 2014 entitled "RADIO FREQUENCY CONNECTION ARRANGEMENT", the contents of which is incorporated herein by reference in its entirety.

TECHNICAL FIELD

The present invention relates generally to a radio frequency circuit implementation for connecting a transmission line referenced to one ground structure to a transmission line referenced to another ground structure, and more specifically, but not exclusively, to a radio frequency transmission arrangement for connecting a radio frequency signal through an aperture in a ground plate from one side of the ground plate to the other, for connection to a transmission line comprising a ground plane.

BACKGROUND

In modern wireless systems, such as for example cellular wireless and fixed radio access wireless networks, there is a need for equipment operating with radio frequency signals, such as radio transceiver equipment in user equipment or at base stations or access points, which is economical to produce, while having high performance at radio frequencies. Increasingly high radio frequencies are being used as spectrum becomes scarce and demand for bandwidth increases. Furthermore, antenna systems are becoming increasingly sophisticated, often employing arrays of antenna elements to provide controlled beam shapes and/or MIMO (multiple input multiple output) transmission. Typically, radio frequency circuits are constructed with unbalanced transmission lines for transmission of radio frequency signals between components of the circuit, such as between amplifiers, filters, detectors, antennas and many other types of radio frequency component. An unbalanced transmission line comprises a conductor, such as a printed track of a circuit board, and a ground structure, such as a ground plane of a circuit board or a conductive ground plate, such as a milled aluminium plate. If one transmission line is connected to another transmission line, it is important that there is a good radio frequency connection between the ground structures of the respective transmission lines. This ensures a low loss connection between the transmission lines and, by ensuring that the conductors are referenced to the same ground voltage, reduces pick up of spurious signals. Conventionally, ground structures may be connected together at radio frequency using the outer conductors of co-axial radio frequency connectors, opposite mating parts of which are connected to the respective ground structures. Such co-axial connectors are typically made to tight mechanical tolerances and are relatively expensive, often being gold plated for example to ensure a good electrical connection and avoid corrosion. Alternatively, or in addition, ground structures may be connected at radio frequency by soldering together or by mechanical fixing of one structure to the other, for example by screws. However, such connections may be expensive to assemble and may require production of mechanical components to tight tolerances. Furthermore, a poorly assembled or corroded direct mechanical attachment between ground structures may result in a poor radio frequency connection resulting in loss or even a connection with non-linear transmission characteristics resulting in generation of spurious signal components. In particular, if a ground plane, for example a conductive layer of a multilayer circuit board, is to be attached to a ground plate, such as a backing plate of an antenna or antenna array, there is typically a need to connect one or more signals that are referenced to the ground plate to components on the circuit board which are referenced to the ground plane of the circuit board. In this case there is a need for a low cost, high performance radio frequency connection, preferably tolerant of mechanical misalignment, between a transmission line referenced to the ground plate and a transmission line referenced to the ground plane.

It is an object of the invention to mitigate the problems of the prior art.

SUMMARY

In accordance with a first aspect of the present invention, there is provided a radio frequency transmission arrangement comprising a ground plate having first and second opposite sides and a boss protruding from said second side of the ground plate, a first transmission line comprising a first elongated conductor passing from the first side of the ground plate through an aperture in the ground plate and the boss, and a second transmission line comprising a second elongated conductor and a ground plane, the first elongated conductor passing through the ground plane to connect to the second elongated conductor, wherein the boss has an end surface disposed in a substantially parallel relationship with the ground plane of the second transmission line, and there is a gap between the end surface of the boss and the ground plane.

This allows an RF connection to be established between the first and second transmission lines with low return loss and a good impedance match while providing an increased tolerance for the relative positions of the ground plane and the ground plate and at lower cost, as compared with an arrangement having a coaxial connector providing a ground connection between the ground plate and the ground plane. It is not obvious to provide a gap, since a good radio frequency connection between ground structures is conventionally provided by a direct electrical connection.

In an embodiment of the invention, the gap between the end surface of the boss and the ground plane comprises an air gap.

An air gap allows a simple implementation. In an alternative embodiment a deformable dielectric medium such as a plastic foam may be included in the gap.

In an embodiment of the invention, the gap between the end surface of the boss and the ground plane is less than 0.02 of a wavelength at an operating frequency of the radio frequency transmission structure.

This provides good transmission properties for the transition between the first and second transmission lines.

In an embodiment of the invention, the gap between the end surface of the boss and the ground plane is less than 0.01 of a wavelength at an operating frequency of the radio frequency transmission structure.

This may provide improved transmission properties for the transition between the first and second transmission lines.

In an embodiment of the invention, the end surface of the boss has a diameter of between 0.1 and 0.6 of a wavelength at an operating frequency of the radio frequency transmission structure plus a diameter of the aperture in the ground plate.

This may provide a good radio frequency connection, by transforming an substantially open circuit between the ground plate and the ground plane at an operating frequency of the arrangement at the outside perimeter of the boss to a substantially short circuit adjacent to the aperture in the boss.

In an embodiment of the invention, the end surface of the boss has a diameter of substantially half a wavelength at an operating frequency of the radio frequency transmission structure plus a diameter of the aperture in the ground plate.

This provides an annular surface to the boss which has a distance from the inside of the annulus, which forms the aperture in the boss, to the outside of the annulus of approximately lambda by 4, where lambda is the wavelength at an operating frequency of the arrangement. This may provide an improved radio frequency connection between the first and second transmission lines.

In an embodiment of the invention, the diameter of the surface of the boss is non-uniform.

This allows the boss to be formed as a shape that is mechanically stable while economical in use of materials.

In an embodiment of the invention, the boss is provided with buttress sections arranged radially.

This arrangement may provide improved mechanical stability while maintaining good radio frequency transmission properties.

In an embodiment of the invention, the first transmission line is coaxial, the aperture in the ground plate being substantially cylindrical.

This allows a convenient implementation of the first transmission line.

In an embodiment of the invention, the second elongated conductor is disposed in a substantially parallel relationship to the ground plane.

This allows a convenient implementation of the second transmission line.

In an embodiment of the invention, the second transmission line is formed by a printed track on a printed circuit board, and the ground plane is a layer of the printed circuit board.

This allows a printed circuit board to be assembled with the ground plate with improved tolerance to mechanical alignment.

In an embodiment of the invention, the ground plate is composed of metal, such as cast aluminium, or a stamped copper sheet.

This may provide improved radio frequency properties by providing a ground plate of low resistivity.

Alternatively, the ground plate may comprises a non-conductive body plated with a metallic conductive surface. The non-conductive body may comprise a plastic material and the conductive surface may comprise copper.

This may provide a ground plate that is economical to manufacture and light weight, while maintaining good radio frequency properties.

In an embodiment of the invention, the radio frequency arrangement further comprises a third transmission line connected by the first transmission line through the ground plate to the second transmission line, wherein the third transmission line comprises a third elongated conductor disposed in a substantially parallel relationship to the first side of the ground plate, the third elongated conductor being connected to the first elongated conductor, whereby to connect signals from the third transmission line on the first side of the ground plate to the second transmission line on the opposite side of the ground plate.

This allows a radio frequency connection to be provided through a ground plate between a transmission line on either side of the plate.

In accordance with a second aspect of the invention, there is provided a method of connecting a first transmission line to a second transmission line, the first transmission line comprising a first elongated conductor passing from a first side of a ground plate to an opposite side of the ground plate through an aperture in the ground plate, and the second transmission line comprising a second elongated conductor and a ground plane, the method comprising:

disposing the first elongated conductor to pass through the ground plane to connect to the second elongated conductor;

providing the ground plate with an aperture passing through a boss protruding from said opposite side of the ground plate, the boss having an end surface through which the aperture in the ground plate passes;

disposing the end surface of the boss being in a substantially parallel relationship with the ground plane of the second transmission line; and providing a gap between the end surface of the boss and the ground plane.

Further features and advantages of the invention will be apparent from the following description of preferred embodiments of the invention, which are given by way of example only.

DETAILED DESCRIPTION

By way of example, embodiments of the invention will now be described in the context of a radio frequency transmission arrangement in which a radio frequency transmission path is provided from one side of a ground plate to the opposite side of a ground plate, the ground plate being a backing plate for an array of printed antenna elements. However, it will be understood that this is by way of example only and that other embodiments may involve transmission paths between transmission lines having various grounding arrangements, not necessarily in the context of antenna systems, where a radio frequency connection is desired between a transmission line having one ground structure and another transmission line having another ground structure. In an embodiment of the invention, an operating frequency of approximately 5 GHz is used, but the embodiments of the invention are not restricted to this frequency, and lower operating frequencies of 1 GHz or less and higher operating frequencies of up to 60 GHz or higher frequencies may be used.

Figure 1:
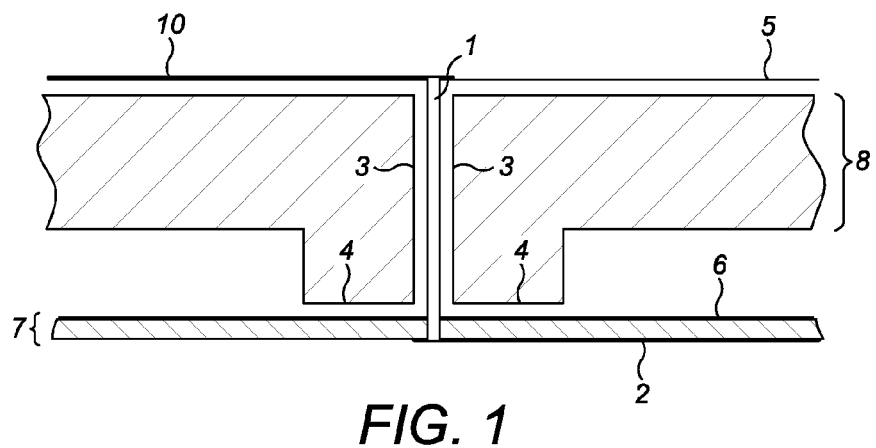
FIG. 1 is a schematic diagram showing a cross-sectional view of a radio frequency transmission arrangement in an embodiment of the invention.

FIG. 1 shows an embodiment of the invention arranged to connect radio frequency signals from a first signal track 10 through a ground plate 8, to a second signal track 2 on the other side of the ground plate. The first signal track is printed on a dielectric substrate 5, and the ground plate 8 provides a ground reference and mechanical support for the track. The ground plate may be a backing plate providing a ground reference and mechanical support for an array of patch antenna elements which are connected to the first signal track by a feed network. The second signal track 2 is referenced to a ground plane 6, which may be the ground plane of a radio transceiver circuit board, the radio transceiver being arranged to transmit and/or receive using the antenna array. A ground plane is typically substantially planar with a substantially constant thickness, for example consisting of a sheet of metal such as copper. A ground plate may have a substantially planar surface, which may include apertures, for example resonant cavities for patch antennas, but may have a non-uniform cross-section, for example comprising fixing posts. The ground plate may, for example, be milled from an aluminium block, cast, or moulded. The term "ground" is used to mean a radio frequency reference, for example for an unbalanced transmission line, which does not necessarily require a direct current (DC) connection to an electrical ground or earth.

The connection through the ground plate 8 is via a first transmission line comprising a first elongated conductor 1 passing from a first side of the ground plate 8 to an opposite side of the ground plate through an aperture 3 in the ground plate. The ground reference of the first transmission line is ground plate 8. The second signal track 2, also referred to as the second elongated conductor 2, forms a second transmission line comprising the second elongated conductor 2 referenced to a ground plane 6. As can be seen from FIG. 1, the first elongated conductor 1 passes through both the ground plate 8 and the ground plane 6 to connect to the second elongated conductor 2.

Figure 2:
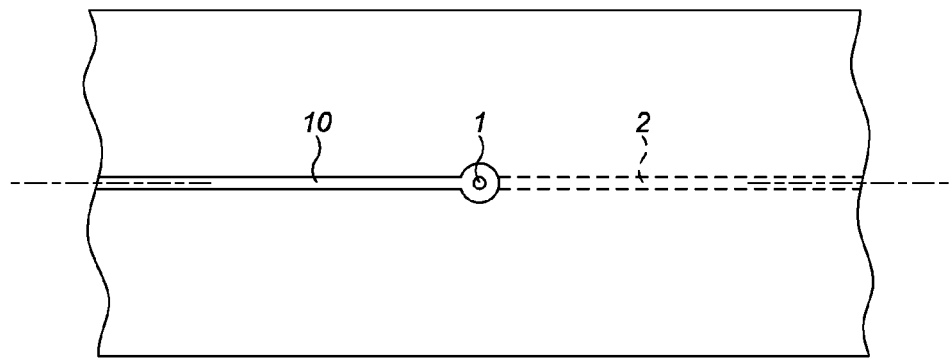
FIG. 2 is a schematic diagram showing a plan view of a radio frequency transmission arrangement in an embodiment of the invention.

FIG. 2 shows the arrangement of FIG. 1 in plan view. It can be seen that the first signal track 10 is connected by the first elongated conductor 1, which may be a pin, through the ground plate to the second signal track 2 on the other side of the ground plate. The first and second signal tracks may be connected to the pin by soldering.

The first signal track 10 forms an unbalanced transmission line referenced to the ground plate 8. Similarly, the first transmission line, which is the connection through the aperture 3 in the ground plate, is also an unbalanced transmission line referenced to the ground plate 8. However, the second transmission line comprising the second signal track 2 is an unbalanced transmission line referenced to the ground plane 6, not the ground plate 8. Typically the ground plane 6 is the ground plane of a printed circuit board. In order to provide a good radio frequency connection from the first transmission line to the second transmission line, it is necessary to provide a good radio frequency connection between the ground references of the respective transmission lines. A good radio frequency connection provides low loss and low return loss, that is to say a good impedance match with low reflections. So, the ground plate 8 needs to be connected at radio frequency to the ground plane 6, so that signals on the respective transmission lines are referenced to the same ground potential at radio frequency.

A conventional method of connecting the ground plate 8 to the ground plane 6 at radio frequency would be by using screws to hold part of the ground plane 6 firmly against the ground plate 8. The touching parts may be suitably plated to guard against corrosion. However, there may be several radio frequency connections required through the ground plate, and the mechanical tolerances for the flatness of the plate and ground plane and its associated circuit board, and the position of the connections may be tight. Furthermore, the connection may be unreliable.

An alternative conventional method of connecting the ground plate 8 to the ground plane 6 at radio frequency, is by using the outer conductors of co-axial radio frequency connectors, opposite mating parts of which are connected to the respective ground structures. The inner conductors would be used to connect the elongated conductor parts of the transmission lines to convey the signal. However, as already mentioned, co-axial connectors are typically made to tight mechanical tolerances and are relatively expensive, often being gold plated for example to ensure a good electrical connection and avoid corrosion. It should be noted that a good low impedance DC (direct current, i.e. zero frequency) connection may not be enough to ensure a good low impedance radio frequency connection, since reactive components may be present which may be significant at radio frequencies but not at DC, and since electrical path length becomes significant at radio frequency.

In embodiments of the invention, the disadvantages of conventional ways of connecting the ground structures are avoided by coupling the ground structures together at radio frequency by the provision of a gap between opposing surfaces of the respective ground structures. To define the gap, a projection, also referred to as a boss, is provided on the ground plate 8, protruding towards the ground plane 6, but stopping short of the ground plane, leaving the gap. The boss protrudes from the opposite side of the ground plate 8 to the side next to which the first signal track runs, and the boss has an end surface 4 through which the aperture 3 in the ground plate 8 passes. The end surface 4 of the boss is arranged to be in a substantially parallel relationship with the ground plane 6 of the second transmission line. The gap is defined between the end surface of the boss and the ground plane.

The gap couples the ground plate 8 to the ground plane 6 in the vicinity of the connection between the first and second transmission lines, allowing a good radio frequency connection to be established between the first and second transmission lines. Conventionally, a direct electrical connection is required to provide a good radio frequency connection between ground structures. However, it has been found that the gap allows a good radio frequency connection to be provided between the ground plate 8 and ground plane 6, so that signals can pass between the first and second transmission lines with low return loss and a good impedance match. The arrangement provides an increased tolerance for the relative positions of the ground plane and the ground plate compared to conventional connection techniques, such as a connection by screws or using a coaxial connector. In particular, the requirement for flatness of the printed circuit board carrying the ground plane 6 and the ground plate 8 is reduced, particularly when multiple connections are provided. Furthermore, the connection is provided at lower cost.

The gap between the end surface of the boss and the ground plane is typically an air gap, but a dielectric medium may be included in the gap, such as a deformable plastic foam.

Good performance may be achieved by setting the gap between the end surface of the boss and the ground plane to be less than 0.02 of a wavelength at an operating frequency of the radio frequency transmission structure. Setting the gap between the end surface of the boss and the ground plane to less than 0.01 of a wavelength at an operating frequency of the radio frequency transmission structure may provide improved transmission properties for the transition between the first and second transmission lines.

The gap is thought to provide a good radio frequency connection by transforming a substantially open circuit between the ground plate and the ground plane at an operating frequency of the arrangement at the outside perimeter of the boss to a substantially short circuit adjacent to the aperture in the boss.

Preferably, the end surface of the boss has a diameter of between 0.1 and 0.6 of a wavelength at an operating frequency of the radio frequency transmission structure plus a diameter of the aperture in the ground plate. It may be particularly beneficial to provide the end surface of the boss with a diameter of substantially half a wavelength at an operating frequency of the radio frequency transmission structure plus a diameter of the aperture in the ground plate. This provides an annular surface to the boss which has a distance from the inside of the annulus, which forms the aperture in the boss, to the outside of the annulus of approximately lambda by 4, where lambda is the wavelength at an operating frequency of the arrangement.

Figure 6:
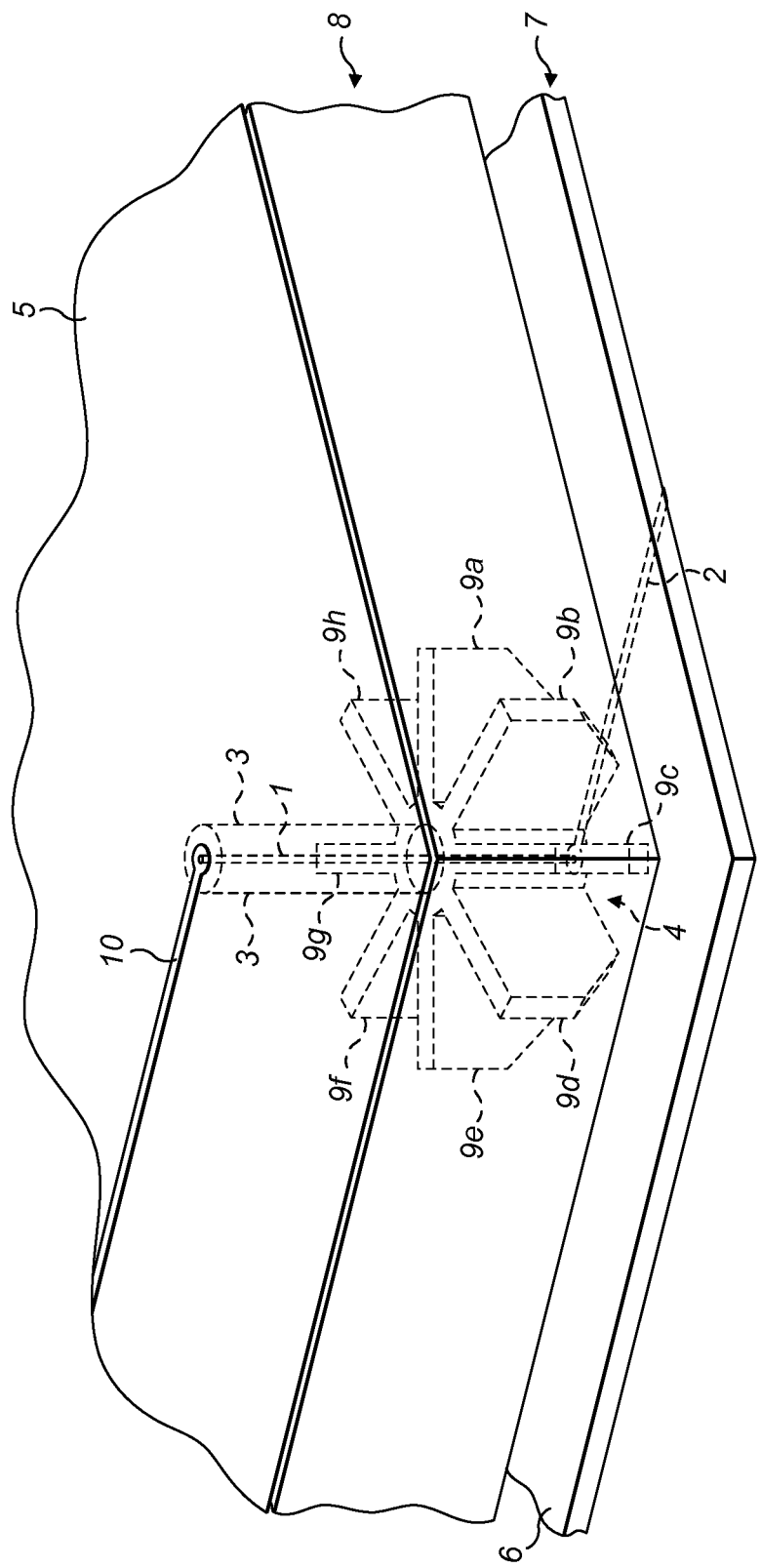
FIG. 6 is a schematic diagram showing an oblique view of a radio frequency transmission arrangement showing a boss having buttress sections arranged radially in an embodiment of the invention.
Figure 7:
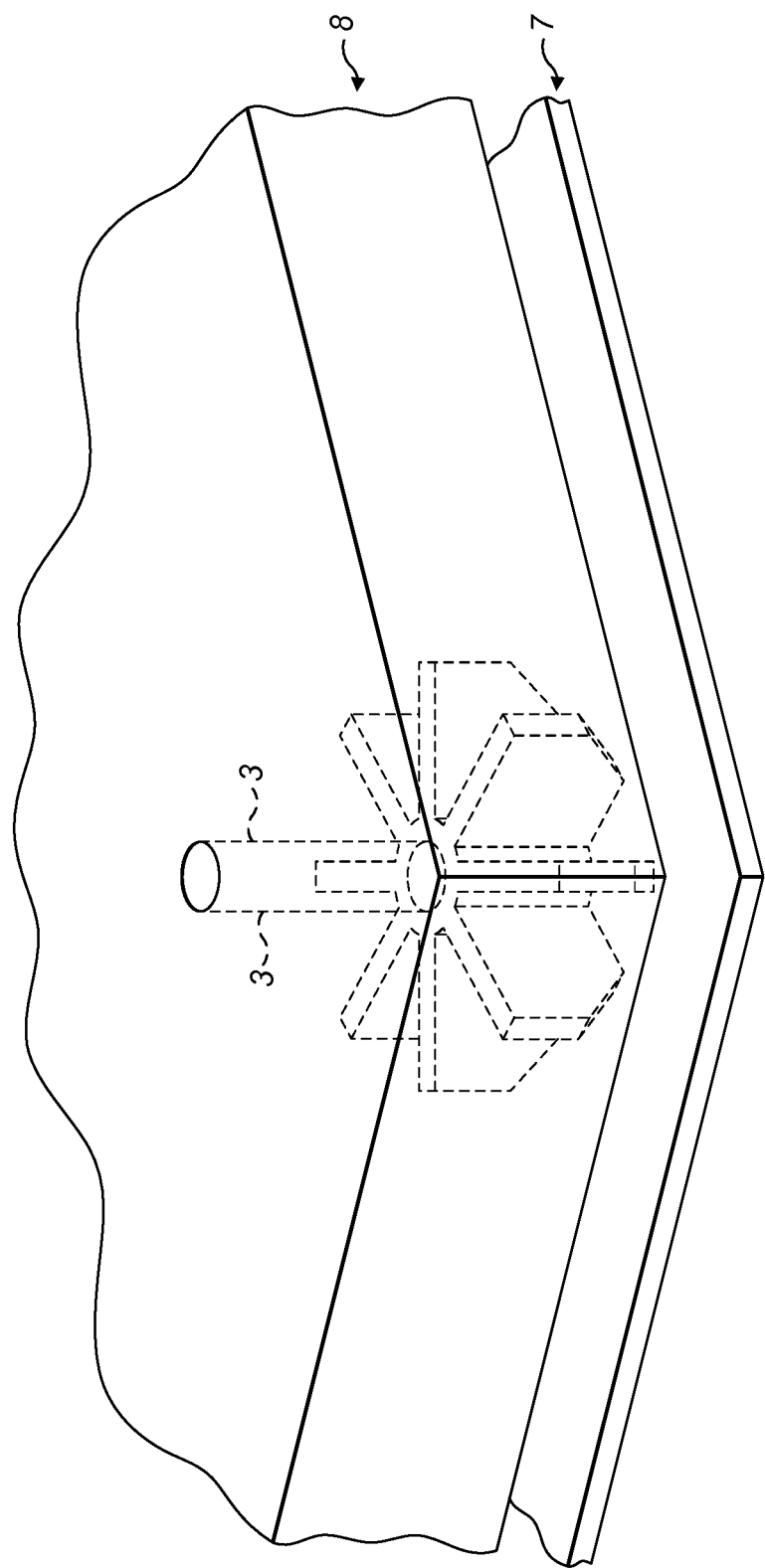
FIG. 7 is a schematic diagram showing a ground plane and a ground plate having a boss with buttress sections in a radio frequency transmission arrangement in an embodiment of the invention.
Figure 8:
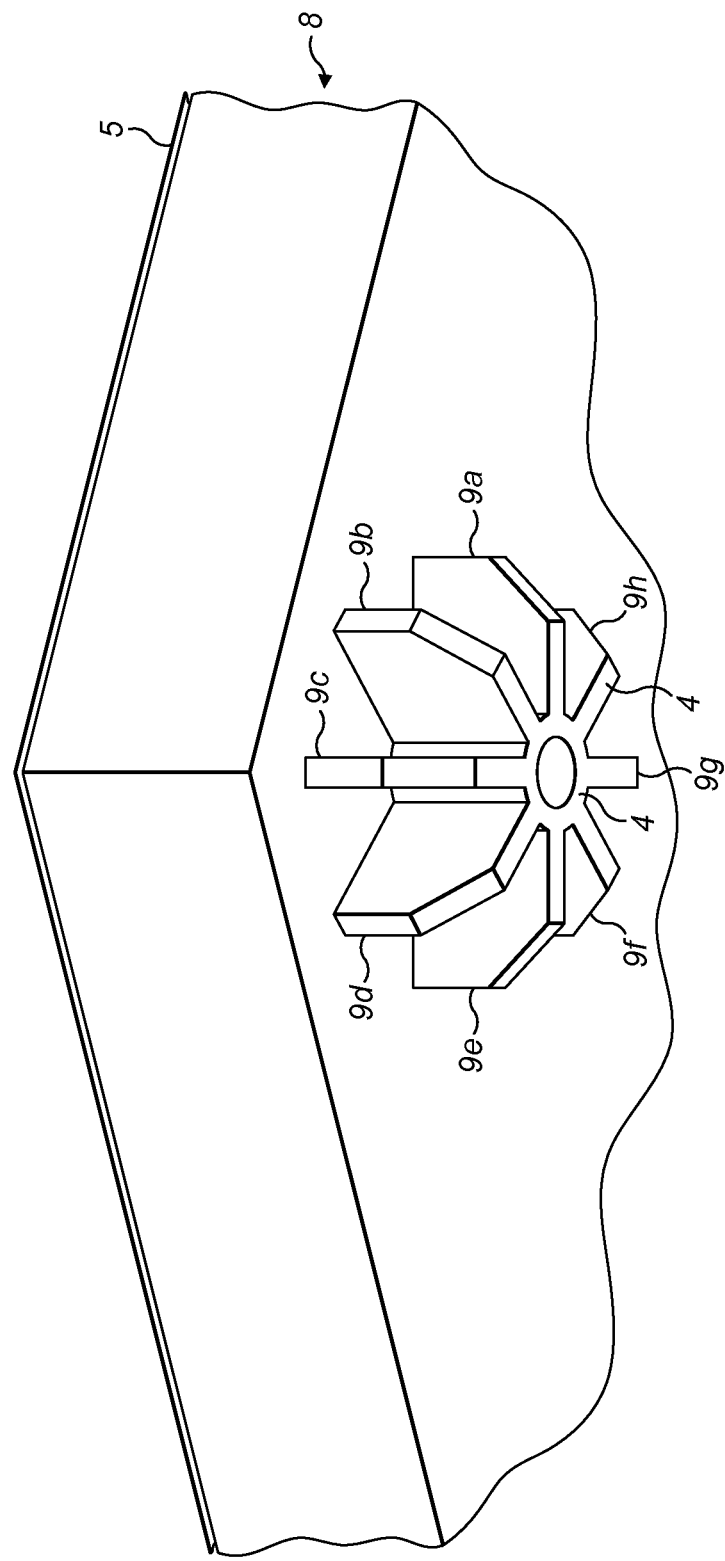
FIG. 8 is a schematic diagram showing an oblique view of a ground plate having a boss with buttress sections, seen from the side of the ground plate having the boss.

The diameter of the surface of the boss may be non-uniform, allowing the boss to be formed as a shape that is mechanically stable while economical in use of materials. For example, the boss may be provided with buttress sections 9a-9h arranged radially as shown in FIGS. 6, 7 and 8, which provides improved mechanical stability while maintaining good radio frequency transmission properties. It can be seen that in this embodiment, the end surface of the boss has an annular part at the centre having radial projections corresponding to the buttresses. It has been found that the radial projections of the end surface of the boss do not degrade coupling between the ground plane and the ground plate across the gap in comparison with a simple annular shape. In this example, the diameter of the boss may be defined by the distance from the end of one projection, through the centre line of the boss and to the end of an approximately opposite projection. There need not be an even number of projections. In the example shown, there are 8 projections, but there may be more or fewer projections than this in embodiments of the invention. For example, there may be as few as one, two or three projections, or up to 20 or more projections.

Figure 3:
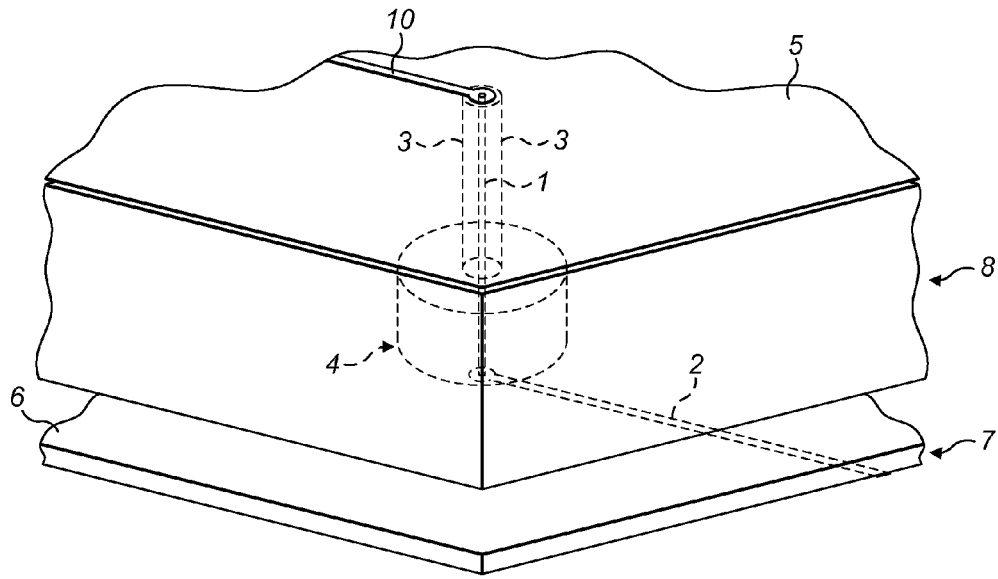
FIG. 3 is a schematic diagram showing an oblique view of a radio frequency transmission arrangement in an embodiment of the invention.

As can be seen in FIG. 3, in an embodiment of the invention, the first transmission line is coaxial, the aperture 3 in the ground plate being substantially cylindrical. However, the first transmission line could be of another type, such as a stripline arrangement for example. As can be seen from FIG. 3 and FIG. 1, in an embodiment of the invention, the second elongated conductor 2 is disposed in a substantially parallel relationship to the ground plane. For example, the second elongated conductor may be a signal track printed on a different layer of a printed circuit board than the ground plane layer. So, the second transmission line is formed by a printed track on a printed circuit board, and the ground plane is a layer of the printed circuit board.

Figure 4:
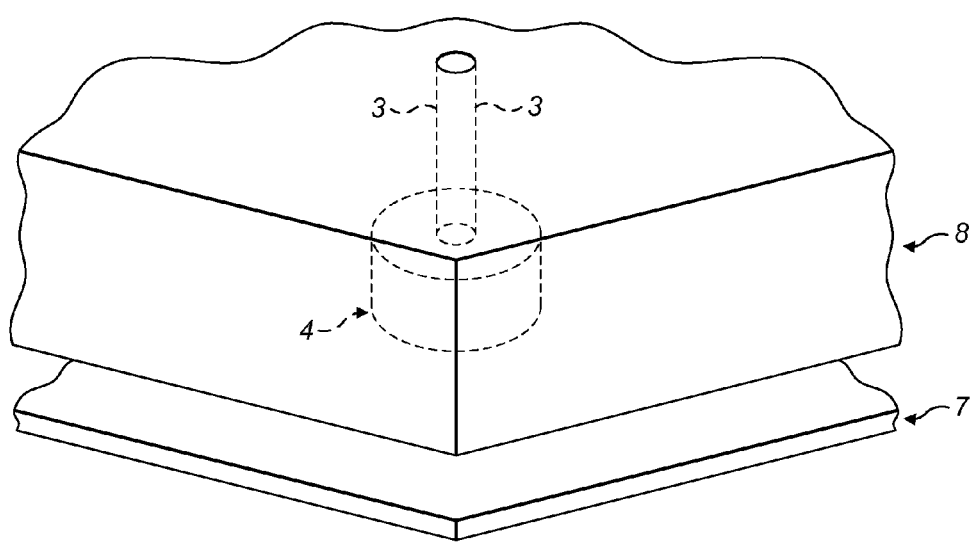
FIG. 4 is a schematic diagram showing a ground plate and ground plane in a radio frequency transmission arrangement in an embodiment of the invention.
Figure 5:
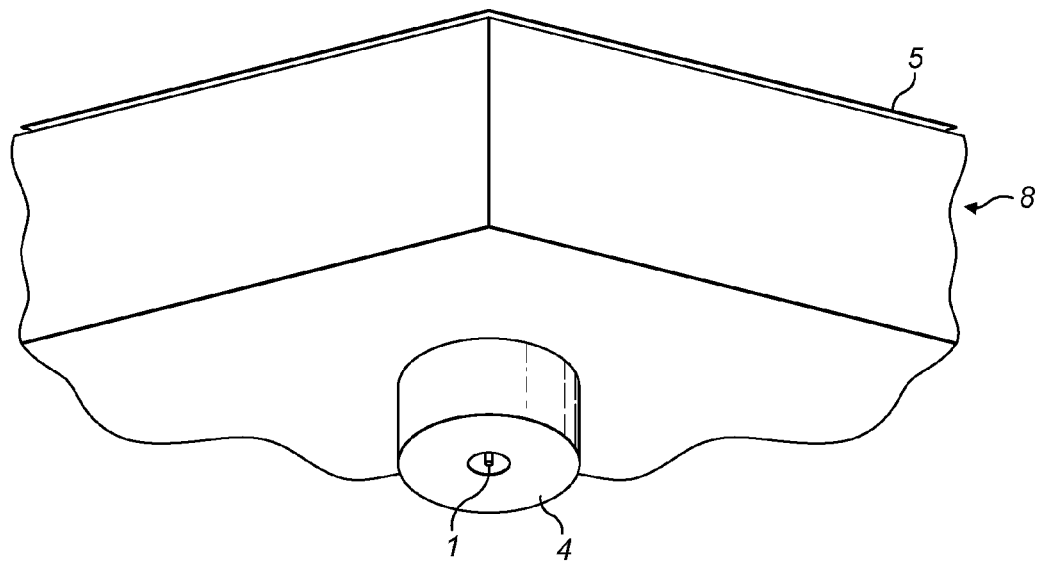
FIG. 5 is a schematic diagram showing an oblique view of a radio frequency transmission arrangement showing a boss having an annular surface in an embodiment of the invention.

FIG. 4 shows a ground plate 8 in oblique view, together with an associated printed circuit board 7, viewed from the opposite side of the ground plate from the boss. FIG. 5 shows the ground plate 8 in oblique view, from the same side of the ground plate as the boss. As shown, the ground plate has flat top and bottom sides, except that the boss protrudes from the bottom, but in other embodiments of the invention, the plate may have different profiles, such that, for example, the bottom surface and top surfaces may not be parallel, and the boss may protrude from the bottom surface at an angle that is not normal to the top surface, and the aperture 3 may also not be normal to the top surface.

The ground plate is composed of metal, such as cast aluminium, or a stamped copper sheet, or the ground plate may comprises a non-conductive body plated with a metallic conductive surface. For example, the non-conductive body may comprise a plastic material and the conductive surface may comprise copper, providing a ground plate that is economical to manufacture and light weight, while maintaining good radio frequency properties.

As shown in FIG. 1, the first signal track 10 referenced to the top surface of the ground plate in the radio frequency arrangement may comprise a third transmission line, connected by the first transmission line through the aperture 3 in the ground plate to the second transmission line, which may be formed of a signal track 2 on a printed circuit board referenced to the ground plane 6. So, the third transmission line comprises the first signal track 10, which may be referred to as the third elongated conductor, which is disposed in a substantially parallel relationship to the first side of the ground plate, the third elongated conductor 10 being connected to the first elongated conductor 1, for example by soldering. In this way, signals are connected from the third transmission line on the first side of the ground plate to the second transmission line on the opposite side of the ground plate, allowing a radio frequency connection to be provided through a ground plate between a transmission line on either side of the plate.

So, it can be seen that in an embodiment of the invention, a radio frequency transmission arrangement comprises a ground plate having first and second opposite sides and a boss protruding from said second side of the ground plate, a first transmission line comprising a first elongated conductor passing from the first side of the ground plate through an aperture in the ground plate and the boss, and a second transmission line comprising a second elongated conductor and a ground plane, the first elongated conductor passing through the ground plane to connect to the second elongated conductor, wherein the boss has an end surface disposed in a substantially parallel relationship with the ground plane of the second transmission line, and there is a gap between the end surface of the boss and the ground plane.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A radio frequency transmission arrangement comprising a ground plate having first and second opposite sides and a boss protruding from said second side of the ground plate, a first transmission line comprising a first elongated conductor passing from the first side of the ground plate through an aperture in the ground plate and the boss, and a second transmission line comprising a second elongated conductor and a ground plane, the first elongated conductor passing through the ground plane to connect to the second elongated conductor,
wherein the boss has an end surface disposed in a substantially parallel relationship with the ground plane of the second transmission line, and there is a gap between the end surface of the boss and the ground plane.

2. The radio frequency transmission arrangement of claim 1, wherein the gap between the end surface of the boss and the ground plane comprises an air gap.

3. The radio frequency transmission arrangement of claim 1, wherein the gap between the end surface of the boss and the ground plane is less than 0.02 of a wavelength at an operating frequency of the radio frequency transmission arrangement.

4. The radio frequency transmission arrangement of claim 1, wherein the gap between the end surface of the boss and the ground plane is less than 0.01 of a wavelength at an operating frequency of the radio frequency transmission arrangement.

5. The radio frequency transmission arrangement of claim 1, wherein the end surface of the boss has a diameter between 0.1 and 0.6 of a wavelength at an operating frequency of the radio frequency transmission arrangement plus a diameter of the aperture in the ground plate.

6. The radio frequency transmission arrangement of claim 1, wherein the end surface of the boss has a diameter of substantially half a wavelength at an operating frequency of the radio frequency transmission arrangement plus a diameter of the aperture in the ground plate.

7. The radio frequency transmission arrangement of claim 1, wherein a diameter of the end surface of the boss is non-uniform.

8. The radio frequency transmission arrangement of claim 1, wherein the boss is provided with buttress sections arranged radially.

9. The radio frequency transmission arrangement of claim 1, wherein the first transmission line is a coaxial line and the aperture in the ground plate is substantially cylindrical in shape.

10. The radio frequency transmission arrangement of claim 1, wherein the second elongated conductor is disposed in a substantially parallel relationship to the ground plane.

11. The radio frequency transmission arrangement of claim 10, wherein the second transmission line is formed by a printed track on a printed circuit board, and the ground plane is a layer of the printed circuit board.

12. The radio frequency transmission arrangement of claim 1, wherein the ground plate is composed of metal.

13. The radio frequency transmission arrangement of claim 12, wherein the ground plate is composed of cast aluminum.

14. The radio frequency transmission arrangement of claim 12, wherein the ground plate is a stamped copper sheet.

15. The radio frequency transmission arrangement of claim 1, wherein the ground plate comprises a non-conductive body plated with a metallic conductive surface.

16. The radio frequency transmission arrangement of claim 15, wherein the non-conductive body comprises a plastic material and the conductive surface comprises copper.

17. The radio frequency transmission arrangement of claim 1, wherein the radio frequency arrangement further comprises a third transmission line connected by the first transmission line through the ground plate to the second transmission line,
wherein the third transmission line comprises a third elongated conductor disposed in a substantially parallel relationship to the first side of the ground plate, the third elongated conductor being connected to the first elongated conductor,
whereby to connect signals from the third transmission line on the first side of the ground plate to the second transmission line on the second side of the ground plate.

18. A method of connecting a first transmission line to a second transmission line, the first transmission line comprising a first elongated conductor passing from a first side of a ground plate to an opposite side of the ground plate through an aperture in the ground plate, and the second transmission line comprising a second elongated conductor and a ground plane, the method comprising:
disposing the first elongated conductor to pass through the ground plane to connect to the second elongated conductor;
providing the ground plate with the aperture passing through the first side of the ground plate, the opposite side of the ground plate, and a boss protruding from said opposite side of the ground plate, the boss having an end surface through which the aperture in the ground plate passes;
disposing the end surface of the boss in a substantially parallel relationship with the ground plane of the second transmission line; and
providing a gap between the end surface of the boss and the ground plane.

19. The method of claim 18, comprising configuring the gap between the end surface of the boss and the ground plane to comprise an air gap.

20. The method of claim 18, comprising configuring the gap between the end surface of the boss and the ground plane to be less than 0.02 of a wavelength at an operating frequency of at least one of the first transmission line or the second transmission line.

21. The method of claim 18, comprising configuring the end surface of the boss to have a diameter between 0.1 and 0.6 of a wavelength at an operating frequency of at least one of the first transmission line or the second transmission line plus a diameter of the aperture in the ground plate.

* * * * *